United States Patent [19]
Westergren et al.

[11] Patent Number: 5,423,076
[45] Date of Patent: Jun. 6, 1995

[54] SUPERHETERODYNE TRANCEIVER WITH BILATERAL FIRST MIXER AND DUAL PHASE LOCKED LOOP FREQUENCY CONTROL

[75] Inventors: Larry L. Westergren; Alan B. Mroch, both of Marion; Gregory A. O'Neill, Jr., Cedar Rapids, all of Iowa

[73] Assignee: Rockwell International Corporation, Seal Beach, Calif.

[21] Appl. No.: 126,949

[22] Filed: Sep. 24, 1993

[51] Int. Cl.⁶ .......................... H04B 1/50; H03L 7/06
[52] U.S. Cl. ...................................... 455/86; 455/12.1;
        455/76; 455/260; 331/14; 331/16; 331/25
[58] Field of Search ........................... 455/84-87,
        455/76, 78, 12.1, 13.2, 13.4, 260, 258-259;
                            331/14, 16, 18, 25, 1 A; 328/14

[56] References Cited

U.S. PATENT DOCUMENTS

| | | | |
|---|---|---|---|
| 3,766,481 | 10/1973 | Rodgers | 455/260 |
| 4,395,777 | 7/1983 | Oki et al. | 455/183.2 |
| 4,513,447 | 4/1985 | Carson | 455/76 |
| 4,520,474 | 5/1985 | Vilmur | 370/24 |
| 4,542,531 | 9/1985 | Fukumura | 455/86 |
| 4,703,520 | 10/1987 | Rozanski, Jr. et al. | 455/75 |
| 4,932,072 | 6/1990 | Toko | 455/76 |
| 5,028,887 | 7/1991 | Gilmore | 331/18 |
| 5,184,092 | 2/1993 | Shahriary et al. | 455/260 |
| 5,239,689 | 8/1993 | Fukuda | 455/86 |

FOREIGN PATENT DOCUMENTS 59-204332  11/1984  Japan ........................... H04B 17/00

Primary Examiner—Edward F. Urban
Assistant Examiner—Mark D. Wisler
Attorney, Agent, or Firm—Gregory G. Williams; M. Lee Murrah; H. Fredrick Hamann

[57] ABSTRACT

A transceiver which operates in separate transmit and receive bands has a first conversion stage for generating a first IF signal translation of a receive signal, which first conversion stage also functions as a first and final, hence, single conversion stage for generating a transmit signal at its transmission frequency. A modulated transmit signal component used in the single conversion to the transmission frequency of the transmission signal has harmonics which lie outside the transmission band and is of a frequency which permits a substantial overlap of transmit and receive injection frequencies generated by a first numerically controlled signal generator which are applied to a first mixer of the first conversion stage during respective transmit and receive mode operations.

12 Claims, 3 Drawing Sheets

| REFERENCE CHOICES |||
|---|---|---|
| ÷ | X | STANDARD FREQUENCY |
| 1 | 12 | 10.24 MHZ |
| 2 | 6 | 20.48 MHZ |
| 3 | 4 | 30.72 MHZ |
| 4 | 3 | 40.96 MHZ |
| 6 | 2 | 61.44 MHZ |
| 12 | 1 | 122.88 MHZ |

SUPERHETERODYNE TRANCEIVER WITH BILATERAL FIRST MIXER AND DUAL PHASE LOCKED LOOP FREQUENCY CONTROL

CROSS REFERENCE TO AND INCORPORATION BY REFERENCE OF RELATED APPLICATION

The descriptive material of patent application by Gregory O'Neill et al, entitled "Virtual Frequency Standard for a Transceiver using an Internal Free Running Stable Frequency Source and an External Frequency Reference Signal", Atty Doc. No. 91CR023 which application is assigned to the assignee of this application, and which is being filed concurrently herewith is incorporated herein by reference in its entirety, including the drawings.

BACKGROUND OF THE INVENTION

The invention relates generally to radio frequency (RF) transceivers and more particularly to microwave transceivers with superheterodyne receive frequency conversion stages.

Features of the present invention address problems that may be found, for example, in mobile communications systems, particularly in mobile communication systems which receive data communications via earth orbiting satellite relay stations. Mobile communication systems have to comply in their transmissions to strict regulatory requirements with respect to frequencies and channel separation. In the case of satellite systems, governmental regulations are furthermore based on international agreements which seek to assure the availability of certain channels to designated, licensed uses and users. Strict frequency control in transmission circuits, and a high degree of selectivity and of spurious signal and image signal rejection in reception circuits would be strived for in the design of communication systems.

In conflict to the development of precision communication systems is a practical requirement for cost reduction in order to offer an economically feasible product. The working environments of mobile communications systems are typically those in which the communications systems support and improve already existing prime service functions. The usefulness of an added communications system is, therefore, measured in terms of direct improvement in the productivity of existing prime service functions. However, the cost of the added communications system, such as a mobile system, is factored into an overall operating cost of the existing prime service system when a net increase of productivity which may be attributable to the communications system is determined. As a general proposition, cost avoidance which may jeopardize precise operating characteristics is untenable in a communications environment in which adherence to strict standards is paramount. Therefore, cost containment without relinquishing tight frequency and signal control is a continuous source of motivation for those working in the field of radio transmitted data communications.

Superheterodyne receiver design architectures used in transceiver or transponder circuits are known to share frequency standards with the counterpart radio transmission circuits. However, further improvements in cost and function are desirable in providing a superheterodyne transceiver which may be used in mobile communications systems including mobile communications system with satellite communications relay stations.

SUMMARY OF THE INVENTION

It is therefore an object of the invention to provide a new and improved transceiver with digital frequency controls which offers a high degree of spurious signal and image rejection with a minimum number of frequency control loops and requires a minimum of preselector filter elements.

It is a further object of the invention to provide a half-duplex transceiver with a superheterodyne receive section of intermediate frequencies in which the products of the injection frequencies of the frequency conversion stages and their harmonics fall outside of the receive band of the transceiver function, and which includes a first frequency conversion stage which is common to the modulated receive and transmit signals.

It is yet another object of the invention to provide a transceiver wherein IF (intermediate frequency) stages are matched to meet requirements for rejection of spurious products and for selectivity and wherein channel selection for both transmit and receive functions is achieved through a first digitally programmable phase locked loop and a direct digital synthesizer for controlling the characteristic frequency of a second phase locked loop.

It is therefore a further object of the invention to provide reliability in a transceiver by minimizing the number of loop circuits required and by a selection of frequency injection ratios which permit the use of common, non-tunable components while maintaining low phase noise.

According to the invention a transceiver circuit has a first bilateral transmit and receive first mixer. A first phase locked loop circuit is coupled to the first mixer. The first phase locked loop circuit includes a voltage controlled oscillator and a numerically controlled frequency control circuit coupled to the voltage controlled oscillator. The first phase locked loop circuit provides a local oscillator translating frequency signal to the first mixer for conversion of a modulated transmit signal to the transmit frequency and for conversion of a received signal from the receive frequency to a first IF (intermediate frequency) signal.

BRIEF DESCRIPTION OF THE DRAWINGS

The Detailed Description including the description of a preferred structure as embodying features of the invention will be best understood when read in reference to the accompanying figures of drawing wherein.

DETAILED DESCRIPTION OF THE INVENTION

Figure 1:
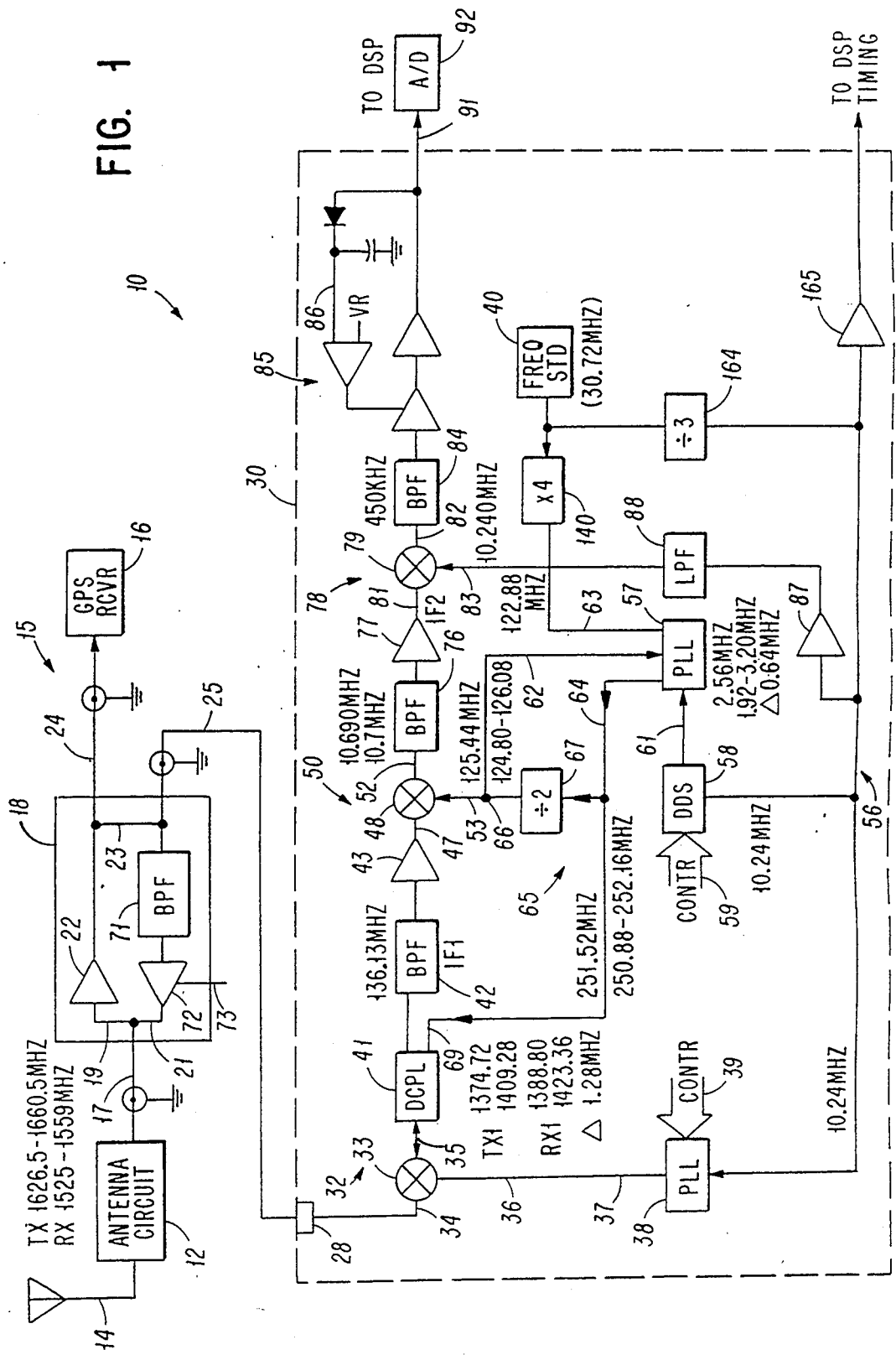
FIG. 1 is a schematic function diagram showing transmit and receive signal paths of a transceiver circuit having features and advantages of the invention.

FIG. 1 is a schematic diagram of a transceiver designated generally by the numeral 10. An antenna circuit assembly 12 (ANTENNA CIRCUIT) is schematically shown with an antenna 14, and would include typical receive preselector filters as well as final transmit filter networks, according to known practices. The antenna 14 is preferably common to both transmit and receive operations. The antenna 14 is desirably used in a mobile communications system 15 which uses satellite relay stations, such as earth-orbiting relay stations, and which may include a concurrent use of global positioning system (GPS) satellites. The antenna 14 therefore receives concurrently a GPS satellite positioning signal on a frequency different from the active frequency bands within which the transceiver 10 either transmits or receives communications messages. A GPS receiver 16 is therefore advantageously coupled into a receive signal path leading from the antenna circuit assembly 12. A coaxial cable 17 couples the antenna circuit assembly 12 to an exciter assembly 18. The exciter assembly shows a split path with a receive path 19 and a transmit path 21. The receive path 19 shows a representative gain block 22 for pre-amplification of a receive signal, which pre-amplification may be achieved for example with two commercially available and serially mounted gain blocks 22, each providing a gain of 11.5 dB.

A signal splitter 23 couples the GPS receive signal through a coaxial cable 24 to the GPS receiver 16. There must not be any interference between the GPS receive signal and any of the receive signal to the transceiver 10, and the intermediate frequencies (IF) of the receive signal transmitted to the transceiver 10. In determining frequencies for signal injections for the intermediate frequencies, it is further required that harmonics or spurious products of the respective IF of the transceiver 10 did not interfere with the GPS frequency. An assigned receive frequency band for the transceiver 10 as described herein as a preferred embodiment of the invention ranges from 1525 to 1559 MHz with designated channel separations of 2.5 kHz. An assigned transmit frequency band ranges from 1626.5 to 1660.5 MHz, also with designated channel separations of 2.5 kHz. The assigned receive and transmit bands are thus not overlapping, and are instead separate and nearby or adjacent, though not without an intervening frequency band gap. The further described receive and transmit frequency controls permit the transceiver 10 to operate with the, for state of the art comparatively narrow, 2.5 kHz channel separation. A coaxial cable 25 couples the exciter assembly 18 to a send-receive port or terminal 28 of a transceiver carrier frequency conversion circuit 30. It may be realized from the description of the transceiver 10 that separate transmit and receive ports or terminals may be used to route the transmit signal via a separate path to a respective antenna. It should be noted, however, that at least one additional mixer would be required to accommodate a transmit port separate from the receive terminal 28. The further described features allow an advantageous use of joint transmit and receive components in at least one mixer of the transceiver 10.

The send-receive terminal 28 is coupled to a first conversion stage which is designated generally by the numeral 32. The first conversion stage 32 includes a first frequency converter or first mixer 33. The first mixer 33 has typically three terminals which according to practice in the art may be designated as an input terminal 34, an output terminal 35 and an injection terminal 36. For simplicity these terms input, output and injection terminals, 34, 35 and 36 are retained even for discussion of the transmit path, even though from a strictly technical point the designations of input terminal 34, output terminal 35 and injection terminal 36 apply and result from the function of the first mixer during a period in which the transceiver 10 operates as a receiver unit or in a receive mode.

An operational cycle of the transceiver 10 contemplates alternate receive and transmit modes, such that the transceiver 10 operates either as a receiver 10 or as a transmitter 10. Since carrier frequency bands or ranges of the respective receive and transmit signals lie in nearby or adjacent and non-overlapping bands, having a non-included bandgap between the respective receive and transmit bands, the transceiver 10 may be referred to as operating in a half duplex mode, being either in a receive mode or in a transmit mode. The carrier frequency in the receive mode always differs from the carrier frequency in the transmit mode. Consequently, the transceiver 10 requires the capability to generate injection signals at frequencies which convert to a desired channel frequency within the transmit frequency band, and to also generate injection frequencies to convert the incoming receive signal carrier through the desired IF stages in preparation for signal demodulation. Injection signal frequencies must be chosen to have spurious products and harmonics which lie outside of both the transmit and receive frequency bands and which do not interfere with the GPS carrier frequency.

The input terminal 34 of the first mixer 33 constitutes a transmission signal port or terminal, being coupled through the send-receive port or terminal 28, the coaxial cable 25, the exciter assembly 18, the coaxial cable 17 and the antenna circuit assembly 12 to the antenna 14. The injection terminal 36 of the first mixer 33 is coupled to a signal output lead 37 of a first numerically controlled frequency generator 38. In the described embodiment, the first numerically controlled frequency generator 38 is a numerically controllable phase locked loop circuit 38 (PLL), shown as the phase locked loop 38 with a numerical control circuit function 39 represented schematically by an arrow 39 (CONTR). The numerical control function or circuit 39 operates on the a reference signal to cause the phase locked loop circuit 38 to generate a feedback signal at a desired injection frequency. The feedback signal is split off and applied to the injection terminal 36 of the first mixer 33. The use of direct digital synthesis to generate a signal of a desired frequency may be more precise than indirectly converging on a desirable frequency by tuning a variable feedback signal frequency through a range and comparing it to a frequency standard in a phase detector to determine a further change for the feedback signal. However, presently available digital synthesizers are incapable of direct digital synthesis of injection signals at in the higher ranges of radio frequency signals, such as microwave carrier frequencies while remaining within international regulations pertaining to phase noise and spurious products. Thus, desired injection signals are typically generated in a phase locked loop circuit in which the controllable signal is generated by a voltage controlled oscillator.

The PLL 38 operates with a preferred reference signal at 10.24 MHz. The 10.24 MHz reference signal is obtained by frequency division of a frequency standard oscillator circuit 40 of 30.72 MHz. The frequency standard 40 makes use of an "oven standard" to control frequency stability. The term "oven standard" is used when a temperature dependent oscillator is heated to a constant, elevated temperature above an anticipated operating temperature range of the equipment within which it functions. Other comparatively stable oscillator sources are known and may be used, such as a frequency stabilized oscillator using a temperature compensating network. The numerical control circuit 39 operates on the PLL 38 to incrementally adjust the frequency of the reference signal in the PLL 38 to the desired frequency of a transmit injection signal in a range of 1374.72 to 1409.28 MHz, and of a receive injection signal in a range of 1388.80 to 1423.36 MHz, each in numerically controlled steps of 1.28 MHz. Phase noise needs to be taken into consideration in selecting injection frequencies. The phase noise being related to 20*logN, where N is the ratio of the receive injection signal divided by the frequency steps, the resulting phase noise ratio yields an acceptable result of 60.9 dB. The injection signal is then applied to the injection terminal 36 of the first mixer 33.

The output terminal 35 of the first mixer 33 is coupled through a directional coupler 41 to a first IF bandpass filter 42. An output from the first IF bandpass filter 42 is coupled to an associated a first IF gain block 43 to correct for insertion losses of the filter 42 and further amplify the receive signal. In the described embodiment, the first IF bandpass filter 42 has a center frequency of 136.13 MHz with a bandwidth from 135.49 to 136.77 MHz. The signal amplification to a desired level may take place in two or more of the gain blocks 43 as first IF gain blocks 43 coupled in series. An output from the gain block 43 is coupled to a signal input terminal 47 of a second mixer 48 of a second conversion stage 50. The terminals of the second mixer 48 are referred to as the input terminal 47, an output terminal 52 and an signal injection terminal 53.

The second conversion stage 50 includes a second numerically controlled frequency generator 56. Operating conditions of the second conversion stage 50 differ somewhat from those of the first conversion stage 32. The second conversion stage 50, as is apparent, operates with signal injections of significantly lower frequencies than the first conversion stage 32. On the other hand, the second conversion stage 50 is also expected in accordance herewith to fine tune or to precisely lock in on the receive frequency, and to perform a channel-select function when the transceiver 10 is going to operate in a transmit mode. A satisfactory frequency resolution may be obtained when the second numerically controlled frequency generator 56 includes a second phase locked loop circuit 57 (PLL) which is controlled through a precise frequency input from a direct digital synthesizer 58 (DDS). A direct digital synthesizer (DDS) is a known circuit which generates through a digital-to-analog signal converter a stepped-wave signal, the shape and frequency of which are respectively formed and controlled by a digital word that is applied through a numerical control input function. The stepped-wave signal is generally coupled through a low pass filter to provide an output signal on a precisely controlled frequency. The DDS 58 operates with the reference signal near 10.24 MHz which is operated on by a control input function 59 (CONTR) to generate a control frequency signal 61. In the described embodiment the control frequency signal 61 ranges from 1.92 MHz to 3.20 MHz and is controllable in discrete frequency increments of about 0.6 Hz. The control frequency signal 61 is applied as a reference frequency to the second PLL 57 and is phase-compared against signal conversions of signals on lines 63 and 64.

A generation of two output signals at essentially a two-to-one frequency relationship is an advantageous feature and requires further explanation. A first output signal at 64 from the second numerically controlled frequency generator 56 is coupled to a two-to-one frequency ratio signal splitter or branching node which is designated generally by numeral 65. The two-to-one signal ratio node 65 yields the first output signal which is controllable in a frequency range approximately twice that of a second output signal at node 66, which second output signal has been passed through a divide-by-two circuit 67. It is understood from the description that the two-to-one frequency ratio of the first and second output signal from the second numerically controlled frequency generator 56 may be obtained by other means, for example, by a multiplication circuit placed in the signal path of the first output signal instead of the preferred divide-by-two circuit in the signal path of the second output signal at the node 66. The second output signal constitutes the feedback frequency at 62 for the generation of a stabilized signal at the numerically controlled frequency of the generator 56. The second output signal also constitutes a second injection signal which is applied to the injection terminal 53 of the second mixer 48.

The first output signal from the second numerically controlled frequency generator 56 appearing at 64 is applied via a transmit signal terminal 69 through the directional coupler 41 to the output terminal 35 of the first mixer 33. It should be understood that the operation of the transceiver 10 which is referred to as a half duplex occurs in alternate transmit and receive modes. Consequently, a switching operation may, for example, block the first output signal from being applied to the directional coupler 41 while the transceiver 10 is operable in a receive mode and block the second output signal from being applied to the injection terminal 53 of the second mixer 48 when the transceiver is operating in a transmit mode.

The two-to-one ratio of the first to the second output signals from the second numerically controlled signal generator 56 allow the control input function 59 of the generator 56 not only to control the carrier channel frequency, but further to modulate the signal. Advantageously, the two-to-one frequency ratio of the two output signals, given the second output signal to be fixed at the desired second injection frequency, allows the first output signal to be at a sufficiently high frequency for a single translation of the modulated signal to the desired channel frequency of the transmission signal. The single translation or conversion of the modulated signal may therefore advantageously take place in the first mixer 33 of the first conversion stage 32. In referring to FIG. 1, it is to be noted, that the first conversion stage 32 of the incoming or receive signal may ideally be a final conversion stage for an outgoing transmission signal before the signal is routed to the exciter assembly 18. Advantageously, a bandpass filter 71 and a corresponding signal gain circuit 72 is advantageously placed into the transmit path 21 of the exciter assembly 18, such that required filters in the transmission path are minimized. The gain circuit 72 may be adjusted, either manually or automatically, through a gain control terminal 73. The signal gain circuit 72 is shown schematically by a single amplifier 72. A convenient implementation of the gain circuit 72 may employ a series of gain blocks 72 to take advantage of commercially available components for an overall desired signal amplification. In a series of several gain blocks or amplifier stages 72, only a single such amplifier stage 72 may employ a gain control 73.

The first and second output frequencies from the second numerically controlled signal generator 56 being in a two to one ratio also places receive and transmit injection signal frequency ranges in the first conversion stage into a substantially overlapping relationship. In the transmit mode of the transceiver 10, the first mixer 33 will operate in an up-conversion mode, while in the receive mode the first mixer 33 down-converts the incoming signal, such that the non-overlapping receive band frequencies (Rx) and transmit band (Tx) may be translated with injections signals for transmit and receive conversions in the first conversion stage to be in a substantially overlapping frequency range.

The second conversion stage 50 down-converts the first intermediate frequency signal (IF1) to a second intermediate frequency (IF2). The converted IF2 signal is coupled from the output terminal 52 of the second mixer 48 through a corresponding bandpass filter 76 and a compensating gain block 77 to a third conversion stage 78. The third conversion stage 78 includes a third mixer 79 with respective input, output and injection terminals 81, 82 and 83. An injection signal applied to the injection terminal 83 of the third mixer 79 is at the reference signal frequency of 10.24 MHz which converts the second intermediate frequency IF2 to a third intermediate frequency (IF3) at 450 kHz. The third intermediate frequency IF3 is passed through a corresponding bandpass filter 84 of the third conversion stage 78 and then through a final amplification stage or final amplifier 85, the amplifier stage including preferably a plurality of gain circuits and an amplitude control feedback loop 86. The 10.24 MHz local source is a preferred common frequency which is applied through a buffer amplifier 87 and a low pass filter 88 (LPF) to the injection terminal 83 of the third mixer 79. An output terminal 91 from the final amplifier 85 carries the converted receive signal at the third intermediate frequency (IF3) which may now be applied to a demodulation circuit. A preferred demodulation circuit includes an analog to digital converter which in turn is coupled to a signal processor for generating a frequency-phase related digital word which defines the phase and frequency of the received IF3 signal in a digital word. The digital word, in turn, may be applied through the numerical control function 39 and control input function 59 to control and adjust the frequencies of the converted signals from respective conversion stages 32 and 50. A copending application by G. A. O'Neill, J. A. Owens, L. L. Westergren, S. Dutta, D. H. Halvorson, A. B. Mroch, D. N. 91CR023, filed on even date herewith, which application is assigned to the assignee of this application, discusses a representative control processor implementation for the control function 39. The descriptive matter in its entirety of said copending application is incorporated herein by reference. Other external digital control functions may be generated and used to control numerically control frequencies of the intermediate frequencies, and thereby control the transmit channel selection and signal modulation of the transmitted signals. Signal connections to demodulation and digitization of the signal are generally depicted by an analog to digital converter 92.

Figure 2:
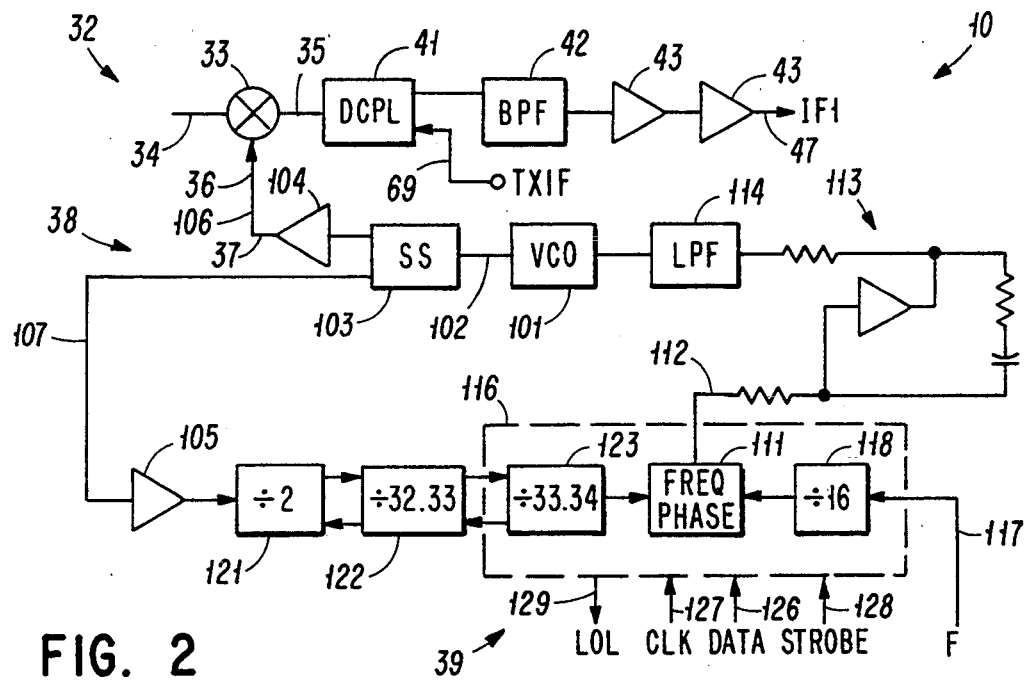
FIG. 2 is a function diagram of a first numerically controlled signal mixer of the transceiver circuit shown in FIG. 1.

FIG. 2 shows the first conversion stage 32 of the carrier frequency conversion circuit 30. In particular, FIG. 2 shows details of a preferred embodiment of the combination of the first PLL 38 and the interacting numerical control circuit 39. Retracing the receive signal path through the first conversion stage, the first mixer 33 is coupled through the directional signal coupler 41 to the first IF bandpass filter 42. The output signal from the first IF bandpass filter 42 passes through a series combination of two first IF gain blocks or first IF signal amplifier stages 43 to recover insertion losses of the bandpass filter and provide the first intermediate signal (IF1), appropriately amplified, to the second conversion stage as defined by the input terminal 47. The modulated intermediate transmit signal (TXIF), is coupled through the transmit signal terminal 69 of the directional coupler 41 selectively only during transmit periods of the transceiver 10. The preferred PLL 38 includes a voltage controlled oscillator 101 (VCO) which has an oscillatory signal output at the desired injection frequency to the first signal mixer 33. The oscillatory output signal is applied from an output terminal 102 of the VCO 101 through a signal splitter 103 (SS) to a first signal buffer amplifier 104 in the injections signal path 106 to the injection terminal 36 of the first mixer 33, and a second signal buffer amplifier 105 disposed in a signal feedback path 107 having its output coupled in turn to the numerical control circuit 39. The preferred numerical control circuit 39 includes a packaged frequency-phase comparator circuit 111 which provides an output signal to the voltage controlled oscillator 101 which is expressed as a cumulative or integrated voltage error signal resulting from the phase comparison of two frequencies. A voltage error signal may appear at an output terminal 112 of the frequency-phase comparator circuit 111 and is integrated through the feedback amplifier circuit 113 before being applied through a low pass filter 114 to a control voltage input terminal 115 of the VCO 101. The numerical control circuit 39 makes use of a typical controllable divider and phase comparator circuit device 116. A local oscillator signal (FL, 10.24 MHz) applied to a local oscillator input terminal 117 of the device 116 is passed through a divide-by-sixteen modulation at 118 the output signal of which is then compared against a numerically modulated feedback signal from the VCO. The feedback signal from the VCO 101 passes through the buffer amplifier 105, through a divide-by-two circuit 121 and through numerically controlled dual modulus logic circuits 122 and 123. Control logic which operates the numerically controllable divider and phase comparator circuit 116 includes a data bus 126 (DATA), a clock signal line 127 (CLK), and a data strobe timing line 128 (STROBE). The data bus 126 may be a preferred serial data input signal. Other numerical circuit configurations may apply a parallel input to a data register. An error output terminal 129 (LOL) provides an error signal on loss of the lock on the loop frequency.

Figure 3:
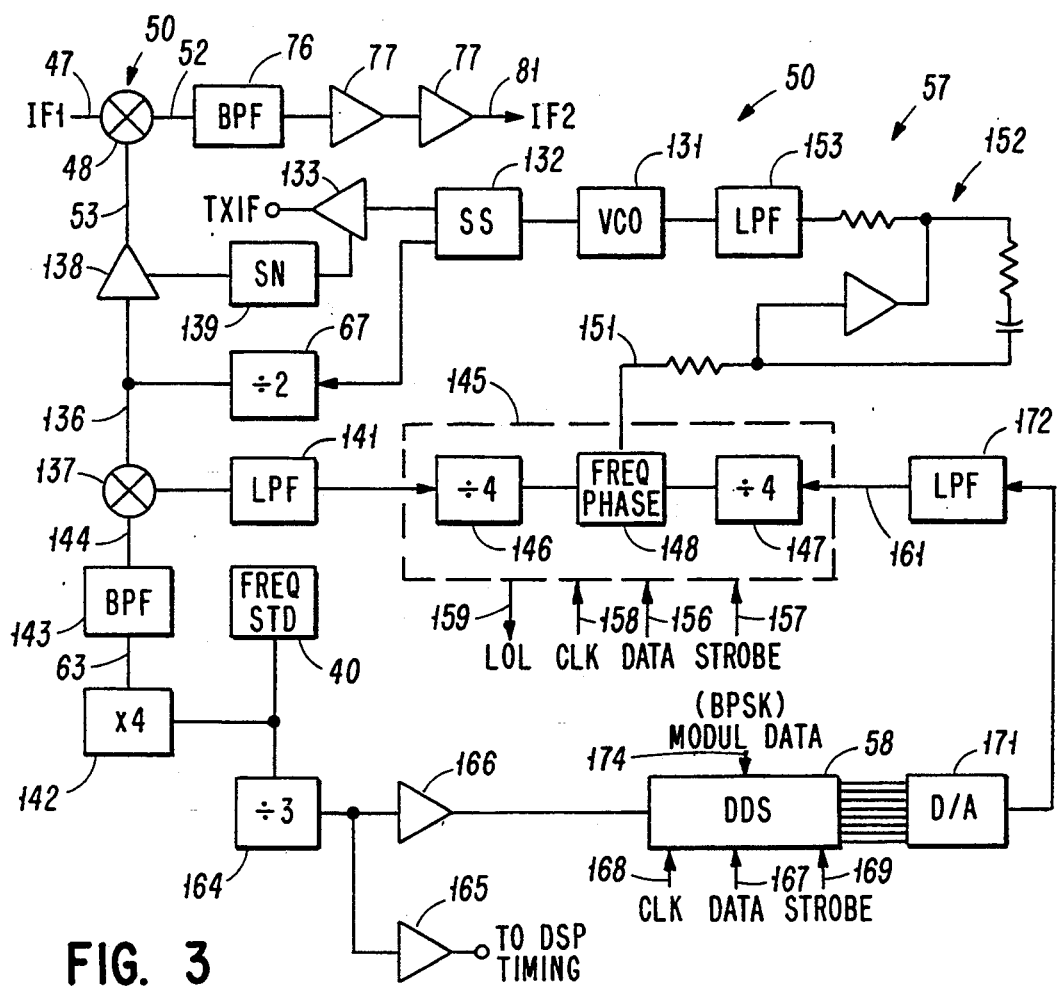
FIG. 3 is a function diagram of a second numerically controlled mixer of the transceiver circuit shown in FIG. 1.

FIG. 3 shows the second conversion stage 50 and shows particular functions which are implemented in an advantageous manner with respect to the particular embodiment shown in FIG. 3. The signal path of the receive signal in its continuation from the second mixer input terminal 47 is through the second mixer 50 and to the output terminal 52 of the second mixer. From the output terminal 52 the second intermediate frequency signal (IF2) passes through the bandpass filter 76 and from there through one or more of the gain blocks or amplifiers 77 to the input terminal 81 of the third mixer 79 (Refer to FIG. 1).

A voltage controlled oscillator 131 (VCO) functions as a signal source of controlled frequency in the second PLL 57. According to a preferred embodiment, the VCO 131 functions in combination with the frequency divide circuit 67 to provide first and second oscillatory output signals which have a preferred two to one frequency relationship to each other. As shown in FIG. 3, the output signal from the VCO 131 is applied to a signal splitter 132 (SS). A first output signal passes through a buffer amplifier 133 and is applied as the transmit intermediate signal (TXIF) to the terminal 69 of the directional coupler 76 (as shown in FIG. 2). A second output signal is passed through the signal divide-by-two function or circuit 67 and is applied as an injection frequency signal to a first input terminal 136 of a loop signal mixer 137. The divide-by-two signal output from the circuit 67 is further applied through a buffer amplifier 138 to the injection terminal 53 of the second mixer 48. A logic switch function 139 may be operated to alternately disable the buffer amplifiers 133 and 138. Thus, power would be removed from the buffer amplifier 133 during a signal receive period, which would cause the output signal TXIF from the buffer amplifier 133 to become blocked. Conversely, during a transmit period, the switch function 139 would maintain the buffer amplifier 133 active, while removing power from the buffer amplifier 138 and thereby removing the second output signal from being applied as a second injection signal to the second mixer 48.

An output terminal 140 of the loop signal mixer 137 is coupled to a corresponding low pass filter 141 with a rejection band above 3.20 MHz. The frequency standard 40 of 30.72 MHz is applied to a times-four multiplier circuit 142, from which the output signal is applied via output terminal 63 to a bandpass filter 143. A filtered output signal at 122.88 MHz is applied to an injection terminal 144 of the loop downconversion mixer 137. The conversion signal or output signal from the loop signal mixer 137 passes through the low pass filter 141 and is applied as a control signal to a second controllable divider and comparator circuit device 145, which may be the same part as the controllable divider and phase comparator circuit device 116, but which is configured differently. The divider and phase comparator circuit 145 is, in contrast to the circuit 116, operated with fixed divide-by-four ratio blocks 146 and 147 operating on respective signals leading into a frequency phase comparator circuit 148. An error signal resulting from the phase comparison is applied as a feedback signal through an accumulator or integrating circuit 152 through a low pass filter 153 as a control voltage signal to the second controlled voltage oscillator 131 of the second PLL 57. The divider and phase comparator circuit 145 includes a respective serial data bus 156, strobe line 157, clock signal line 158 and loss of lock alarm output lead 159. During operation, the data word applied to the data bus 156 remains fixed to render modulus division circuits to provide the fixed divide-by-four divider functions 146 and 147. Instead of controlling the loop by operating on the frequency of the feedback signal to arrive at a control input to the VCO 131, the numerical control of the PLL 57 associated with the second conversion stage 50 is controlled by controlling the frequency of the signal which is applied at a local oscillator terminal 161 of the divider and phase comparator circuit 145.

The preferred phase control is at a frequency which is compatible with the operating speed of the direct digital synthesizer (DDS) 58. The DDS 58 may therefore be used to generate a digitally generated frequency which may be controlled with a high degree of resolution between adjacent steps. The controllable accuracy of the frequency signal permits frequency changes in steps or intervals of 0.6103515625 Hz. The source signal input to the DDS 58 is taken from the common frequency standard 40, which signal is operated on by a divide-by-three circuit 164. The divide-by-three circuit yields the preferred local source frequency of 10.24 MHz which also becomes a timing source for the DSP demodulation, being routed through a buffer amplifier 165. The 10.24 MHz signal becomes a source signal for the DDS 58 after passing through a buffer amplifier device 166. The signal generation operation of the DDS is controlled through a respective serial data bus 167. A signal word transferred via the bus 167 defines the frequency which will be generated. The operation of the DDS 58 is further controlled by clocking pulses on a clock input 168 and by a data strobe signal on a data strobe line 169. These signals may be originated by any of a number of known means, as for example by the related control processor disclosed in the related co-pending patent application, Ser. No. 08/126,249, or by another microprocessor circuit. The generated digital frequency signals are converted by a digital to analog converter 171 to an oscillatory signal with the desired frequency. The oscillatory signal is shaped from a stepped to a smoothly transitioning signal by a low pass filter 172. The oscillatory signal is then applied to the local oscillator signal terminal 161 of the frequency and phase comparator circuit 145.

It is to be noted that the DDS 58 is operated during a receive mode to step quickly through its range of 1.92 to 3.20 MHz. The stepping operation provides the described stepped input frequencies to the PLL 57 in generating a series of injection frequencies for the second signal injection at terminal 53. The series of injection frequencies is used in the process of acquiring and then ultimately locking in on a desired receive channel center frequency. But the DDS is further operated to provide a predetermined digitized frequency signal, also chosen from the same stepped frequency range of 1.92 to 3.20 MHz to provide a frequency component for conversion to the transmit carrier frequency. Thus, the second mixing stage and the DDS 58 as the frequency controlling component for the second loop is instrumental in the channel selection or tuning for channel width of 2.50 kHz. The DDS 58 is further functional, in accordance herewith, to digitally modulate the transmit carrier frequency component with intelligence. Various known modulation schemes may be implemented, though it should be realized that the bandwidth of the phase locked loop must be adequate to pass the modulation. According to a preferred example, the digitally generated signal is advantageously modulated by binary phase shift keyed (BPSK) modulation. Such BPSK modulation is well suited for digital data transmission at relatively low data rates as, for example, 600 or 1200 bits or samples per second. The BPSK modulation is further well suited for mobile communications systems using satellite relay stations. The modulation is ideally achieved in the DDS 58 by switching only a single binary signal input line 174 between logical high and logical low signal levels.

In reference to FIGS. 1, 2 and 3, and referring back to the prior description, digital frequency control may be exercised by the DDS 58 to switch the transceiver quickly to a transmit frequency, after the transceiver 10 had been locked in on a given receive channel. As described above, the transmit and receive bands assigned to satellite carried transmissions for mobile radio communications systems are separate bands in the 1600 and 1500 MHz ranges, respectively. Channel selections for both transmit and receive channel selections are made, however, by controlling the DDS 58 within the same range of control frequencies, in the preferred example, over the range of from 1.92 to 3.20 MHz. Because of such overlapping range, the resolution of steps executed by the DDS 58 is correspondingly greater, with a correspondingly minimized range over which frequency changes extend. In addition, any frequency changes may occur with a minimal number of digital changes, advantageously affecting the time responsiveness of the frequency control in the PLL 57.

The advantageous frequency control range in the second PLL 57 to perform channel control over both transmit and receive channels may be implemented as a result of the described two-to-one frequency ratio of the first and second output frequencies as controlled by the PLL 57 in combination with the two-to-one ratio frequency signal branch or splitter 65. In the preferred example, the two-to-one ratio is advantageously generated by the divider circuit 67 that is inserted into the feedback signal loop and from which the second signal, namely the second injection signal is applied to the injection terminal 53 of the second mixer 48. A multiplication circuit, however, inserted into the output circuit to the directional coupler 41 would also be possible to achieve a similar result. However, for digital accuracy and simplicity, the described divider circuit 67 is preferred. The advantageous two-to-one frequency relationship of the first and second output signals generated by the second PLL 57 and the two-to-one signal splitter 65 permit the modulated transmit component to be at an frequency in the range between 250.88 and 252.16 MHz. For example, harmonics of the modulated transmit conversion component fall outside of the transmit band.

A further advantage of the two-to-one signal relationship between the first and second output signal is realized in that the first injection frequencies applied during transmit and receive modes to the injection terminal 36 of the first mixer 33 substantially overlap. What is meant by substantial overlap is most readily seen in reference to FIG. 4. A VCO 101 selected to be used in the first conversion stage 32 may be a device which may have a voltage controlled tuning range of 6 volts between a minimum voltage signal of 2 volts and a maximum voltage signal of 8 volts. In such 6 volt range, the VCO 101 may be nominally tuned over a frequency range between 1326.61 to 1499.53 MHz. In an actual situation, the tuning ranges may vary because of tolerances of the components of the VCO 101. Laterally displaced injection bands for the respective transmit and receive injection frequencies would occupy a major portion of the nominal range of the VCO 101. However, because of an overlap in the tuning bands for the respective receive injection frequencies (RX INJ) and transmit injection frequencies (TX INJ), less of the nominal tuning range of the VCO is used while selecting proper injection ranges over the maximum permissible band spread. In reference to FIG. 4, common injection frequencies would lie in the band between 1388.80 and 1409.28 MHz. While such overlap or commonality of the selectible frequencies for the transmit and receive injection signals is not a full overlap, it is a substantial overlap and can be described as such, when the complete lateral separation of the transmit and receive bands are considered. Also, the substantial overlap may be called that, in that the overlap has the practical effect of alleviating a requirement that the VCO is an adjustable or pretunable component. The VCO 101 is instead permitted to be a fixed or non-adjustable device which may simply be built into the transceiver circuit without specially "tweaking" or adjusting certain components thereof. It is readily seen that such a requirement would unduly raise the cost of the transceiver circuit.

The two-to-one frequency ratio of the first and second output signals from the second PLL 57 in permitting the single translation of the modulated signal to the final transmission signal, significantly reduces the filtering requirement and permits the bandpass filter 71 from the single transmission signal conversion to be located in the exciter circuit 18. But in addition, the use of the two-to-one signal splitter 65 further provides an advantageously low number of components in the transceiver 10. For example, it will be seen that only two PLL circuits are required in accommodating the processing of signals over the entire spectrum of transmission and receive frequencies. In addition the bandpass filter 76 substantially coincides with bandpass filter components which are used in well known broadcast FM tuner circuits, while the bandpass filter 84 of the third conversion stage corresponds to filters which are common in broadcast AM tuners. The cost of components is therefore optimized by permitting the use of commonly used filter components following the third and the second conversion stages 78 and 50.

Figures 4, 5:
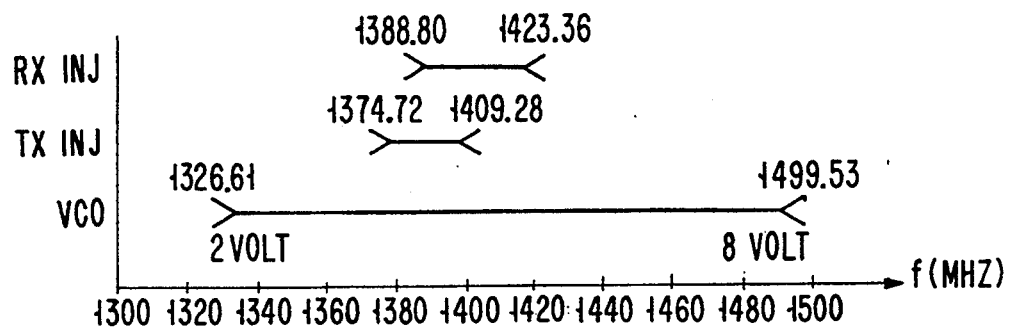
FIG. 4 is a schematic frequency range graph showing exemplary frequency signal limits of a voltage controlled oscillator and numerically controlled frequency signal ranges of signals of transmit and receive IF signals generated by the voltage controlled oscillator.
FIG. 5 is a table of possible frequency standards which may be considered feasible frequency standards in operating the transceiver circuit shown in FIG. 1.

FIG. 5 illustrates variation of reference standards that may be used in conjunction with the described transceiver 10. As may have become apparent from the foregoing, a common reference frequency or frequency standard is desirable. The selected 10.24 MHz signal as a local source is desirable in that harmonics of such base reference signal do not fall on any of the receive IF bands. FIG. 5 shows divide and multiplication device combinations which would result in obtaining the desired local source. Even though a multiplication circuit is typically a linear circuit, the multiplication circuit 140 was considered from a cost and reliability standpoint in conjunction with the divide by three circuit 164 to be an optimum choice. The other combinations shown in FIG. 5 are also feasible, though less desirable.

As must have been realized from the above detailed description, the embodiments therein are illustrative and are specific examples of apparatus and methods pursuant to the invention. Various changes and modification to the described circuits and their application may be made in view of the above description without departing from the spirit and scope of the invention which is defined by the claims below.

What is claimed is:

1. A transceiver operable in alternate receive and transmit modes, which comprises:

a first conversion stage including a first mixer having an input terminal, an output terminal and an injection terminal, means for coupling the input terminal of the first mixer to antenna means for receiving and transmitting radio frequency signals, first means for generating frequency signals, first means for generating frequency signals at a numerically controlled frequency of a first range of frequencies coupled to the injection terminal of the first mixer for applying to the injection terminal of the first mixer an injection signal at a frequency for a frequency up-conversion during periods of operation of the transceiver in a transmit mode, and at a frequency for a frequency down-conversion during periods of operation of the transceiver in a receiver mode; and a second conversion stage selectively coupled with said first conversion stage including a second mixer having an input terminal, an output terminal and an injection terminal, second means for generating frequency signals at a numerically controlled frequency of a second range of frequencies, frequency ratio circuit means for providing in response to a voltage controlled oscillator signal first and second frequency output signals at a two-to-one ratio, respectively, means for coupling a generated frequency signal from the second frequency generator to the frequency ratio circuit means, means for coupling the first frequency output signal to the output signal to the output terminal of the first mixer upon the transceiver being operable in the transmit mode and for coupling the second frequency output signal to the injection terminal of the second stage upon the transceiver being operable in the receive mode.

2. The transceiver according to claim 1, wherein the first numerically controlled frequency signal generating means comprises a first phase locked loop circuit including first phase detector and a first voltage controlled oscillator having a signal output terminal, the signal output terminal being coupled to the injection terminal of the first mixer, and a numerically controlled frequency generator circuit coupled through the first phase detector to the voltage controlled oscillator for driving the voltage controlled oscillator alternately at a frequency for a frequency up-conversion signal, and at a frequency for a frequency down-conversion signal during periods of operation of the transceiver in the transmit mode and in the receive mode, respectively.

3. The transceiver according to claim 2, wherein the transceiver is operable in adjacent, non-interfering transmit and receive frequency bands, and respective frequency injection signal ranges of a receive injection signal and a transmit injection signal corresponding to band spectrum coverage for the transmit and receive frequency bands overlap.

4. The transceiver according to claim 2, wherein the first voltage controlled oscillator has a non-adjustable tuning range, and frequency injection signal ranges of the receive injection signal and the transmit injection signal corresponding to band spectrum tuning over assigned transmit and receive frequency bands cover less than one-third of a working range of the first voltage controlled oscillator.

5. The transceiver according to claim 1, wherein the second numerically controlled frequency signal generating means comprises a second phase locked loop circuit, the second phase locked loop circuit including a second phase detector and a second voltage controlled oscillator having a signal output terminal, and a numerically controlled digital frequency synthesizer circuit coupled through the second phase detector to the second voltage controlled oscillator for driving the voltage controlled oscillator at a predetermined frequency corresponding to a channel-select injection signal, the channel-select injection signal having data modulation in response to the transceiver being operable in the transmit mode.

6. The transceiver according to claim 1, wherein the first numerically controlled frequency signal generating means includes control means for generating frequency range control signal for injection into the first mixer, and the second numerically controlled frequency generating means includes control means for generating frequency signals at a frequency corresponding to channel-select injection signals, and for communicatively modulating the channel-select injection signals in response to the transceiver being operable in the transmit mode.

7. The transceiver according to claim 6, comprising a standard frequency signal source coupled to the first and second conversion stages, for providing a common reference signal to the first and second conversion stages.

8. The transceiver according to claim 6, comprising a third conversion stage including a third mixer having an input terminal, an output terminal and an injection terminal, the common reference signal being coupled to the injection terminal of the third conversion stage, the respective output terminals of the first, second and third mixers being coupled to respective first, second and third bandpass filters, wherein the second bandpass filter has a center frequency of 10.7 MHz and the third bandpass filter has a center frequency of 450 kHz, an output signal from the third mixer being applicable to a demodulator.

9. The transceiver according to claim 6, wherein the frequency ratio circuit means comprises a signal splitter having an input and first and second output terminals, and a divide-by-two circuit, the divide-by-two circuit being coupled to the second output terminal, whereby the second signal is applied through the divide-by-two circuit to the injection terminal of the second mixer.

10. A satellite communications system comprising;
a first receiver means for receiving a first satellite signal from a plurality of satellites; and
a transceiver having a second receiver stage and being operable in alternate receive and transmit modes, wherein the transceiver further comprises a first conversion stage including a first mixer having an input terminal, an output terminal and an injection terminal, means for coupling the input terminal of the first mixer to an antenna means for receiving and transmitting radio frequency signals, a first phase locked loop circuit including first phase detector and a first voltage controlled oscillator having a signal output terminal coupled to the injection terminal of the first mixer, and a numerically controlled frequency generator circuit coupled through the first phase detector to the voltage controlled oscillator for driving the voltage controlled oscillator alternatively at a frequency for a frequency up-conversion signal, and at a frequency for a frequency down-conversion signal during periods of operation of the transceiver in a transmit mode and in a receive mode, respectively, and a second conversion stage, selectively coupled with said first conversion stage, including a second mixer having respective input, output and injection terminals, a second phase locked loop circuit, the second phase locked loop circuit including a second phase detector and a second voltage controlled oscillator having a signal output terminal, circuit means for providing first and second signals at first and second frequencies at a two-to-one frequency relationship, respectively, the signal output terminal of the second voltage control led oscillator coupled to and forming part of the circuit means for providing first and second signals, means for alternatively coupling the first signal to the output terminal of the first mixer and the second signal to the injection terminal of the second mixer in response to the transceiver being operable, respectively, in the transmit mode and in the receive mode, a numerically controlled digital frequency synthesizer circuit coupled through the second phase detector to the second voltage controlled oscillator for driving the voltage controlled oscillator at a predetermined frequency corresponding to a channel-select injection signal, the channel-select injection signal having data modulation in response to the transceiver being operable in a transmit mode.

11. The satellite communications system according to claim 10, wherein the transceiver circuit means for providing first and second signals at first and second frequencies at a two-to-one frequency relationship comprises a divide-by-two frequency divider, and wherein the signal output terminal of the second voltage controlled oscillator is coupled through the divide-by-two frequency divider to the injection terminal of the second mixer.

12. The satellite communications system according to claim 10, wherein the first receiver means receives the first satellite signal on a frequency which is distinct from the frequencies of signals received and transmitted by the transceiver.

* * * * *